US012574043B2

US 12,574,043 B2

(12) United States Patent
Gu et al.

(10) Patent No.: US 12,574,043 B2
(45) Date of Patent: Mar. 10, 2026

(54) CAPACITIVE DAC STRUCTURE

(71) Applicant: Shanghai Huali Integrated Circuit Corporation, Shanghai (CN)

(72) Inventors: Jingping Gu, Shanghai (CN); Yifei Qian, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 118 days.

(21) Appl. No.: 18/426,056

(22) Filed: Jan. 29, 2024

(65) Prior Publication Data

US 2024/0275398 A1     Aug. 15, 2024

(30) Foreign Application Priority Data

Feb. 14, 2023     (CN) .......................... 202310111001.2

(51) Int. Cl.
H03M 1/66 (2006.01)

(52) U.S. Cl.
CPC ..................................... H03M 1/66 (2013.01)

(58) Field of Classification Search
CPC ........ H03M 1/66; H03M 1/468; H03M 1/804; H03M 1/802; H03M 1/002; H03M 1/1245
See application file for complete search history.

(56) References Cited

U.S. PATENT DOCUMENTS

| | | | |
|---|---|---|---|
| 7,170,439 B1 * | 1/2007 | Chen ................... | H03M 1/1009 |
| | | | 341/172 |
| 9,124,288 B2 * | 9/2015 | Umezaki ............... | H03M 1/109 |
| 9,425,814 B1 * | 8/2016 | Verma ................... | H03M 1/468 |
| 9,432,044 B1 * | 8/2016 | Lee ...................... | H03M 1/1061 |
| 10,148,280 B2 * | 12/2018 | Lee ...................... | H03M 1/462 |
| 10,790,847 B1 * | 9/2020 | Neto ...................... | H03M 1/462 |
| 2010/0201552 A1 * | 8/2010 | Kuo .................... | H03M 1/1061 |
| | | | 341/121 |

* cited by examiner

*Primary Examiner* — Toan N Pham
(74) *Attorney, Agent, or Firm* — Quarles & Brady LLP

(57) ABSTRACT

This application provides a novel capacitive DAC structure, which at least includes a fully differential DAC capacitor array, a comparator, and a sampling and holding switch provided between the fully differential DAC capacitor array and the comparator. In this application, by providing the sampling and holding switch, including a first logic switch, a second logic switch and a third logic switch, between the fully differential DAC capacitor array and the comparator, and changing the timing relationship of the switches to generate a stable common mode level Vcm, the area and power consumption can be greatly reduced, the IP competitiveness can be effectively improved, and it can be used for high-performance ADC design.

5 Claims, 3 Drawing Sheets

CAPACITIVE DAC STRUCTURE

CROSS-REFERENCES TO RELATED APPLICATIONS

This application claims the priority to Chinese patent application No. CN 202310111001.2, entitled "NOVEL CAPACITIVE DAC STRUCTURE", and filed on Feb. 14, 2023 at CNIPA, the content of which is incorporated herein by reference in its entirety.

TECHNICAL FIELD

This application belongs to the field of CMOS integrated circuit design, and in particular relates to a novel capacitive DAC structure.

BACKGROUND

The traditional Successive Approximation Register Analog-to-Digital Converter (SAR ADC) has been widely studied and applied due to its simple operating principle, almost fully digital characteristics, and low power consumption. In recent years, with the shortening of the process, the almost fully digital SAR ADC has received people's attention. A large number of technological innovations have improved the comprehensive performance of SAR ADC. Nowadays, SAR ADC has become the preferred structure for medium to high precision, low power consumption, and high-speed ADCs. Compared with the traditional resistive DACs (Digital-to-Analog Converter) and current DACs, charge redistribution (capacitive) DACs are composed of capacitors and do not have static power consumption, and DAC capacitors are compatible with switch capacitor circuits.

The traditional SAR ADC system circuit includes a sampling and holding circuit, a DAC, a comparator, an SAR control logic circuit, and a buffer. Its schematic diagram is as illustrated in FIG. 1. SAR ADC essentially implements a binary search algorithm. Through the control of the clock, comparison signals are generated one by one in order from the highest bit to the lowest bit, and then the comparison results are latched to form the final digital output code.

Since the DAC capacitor in the capacitive SAR ADC can be shared with the sampling and holding capacitor, taking a 12-bit differential input capacitive SAR ADC as an example, the schematic diagram of sampling, holding and charge redistribution is as illustrated in FIG. 2. Its principle is based on a binary algorithm search method.

Its basic working principle is as follows: firstly, in a sampling stage, two upper electrode plates are connected to a common mode voltage (Vcm), two lower electrode plates are respectively connected to differential input signals $V_{inP}$ and $V_{inN}$, sampling is performed by using a DAC capacitor array, and charges are stored in a DAC capacitor; after the sampling is completed, the process enters a holding stage, a switch for connecting the upper electrodes plates to Vcm is disconnected, the lower electrode plates are grounded, and the changes in the potentials of the lower electrode plates of the capacitors cause the charges to be redistributed between the capacitors, so that the potentials $V_{DACP}$ and $V_{DACN}$ of the upper electrode plates of the capacitors are changed; then the process enter a comparison stage, $V_{DACP}$ is compared with $V_{DACN}$, a comparison result is feed back to the DAC capacitor through SAR logic, the switch S of the lower electrode plate of the DAC capacitor is controlled, the charge redistribution and comparison processes are cycled to sequentially generate high-bit to low-bit comparison results until all bits have completed a comparison, the comparison results are latched, and finally a 12-bit logic output is obtained.

However, with the changes in application requirements, higher requirements have been put forward for the performance of SAR ADC, which faces improvements in speed, accuracy, power consumption, and area. In the existing circuits mentioned above, the Vcm voltage generally needs to be generated by a common mode voltage module. The common mode voltage is ½ of the sum of reference voltages ½($V_{REFP}$+$V_{REFN}$), and is often achieved by using a voltage divider or current mirror bias (FIG. 3). The traditional common mode level Vcm causes linear increase of circuit power consumption and area with the increase of speed, resulting in limited performance. During each sampling stage, the Vcm voltage generation circuit needs to charge and discharge the upper electrode plates of the entire capacitor array to achieve the Vcm voltage. Throughout the sampling stage, the Vcm voltage generation module has sustained static power consumption to keep the Vcm voltage stable. As the proportion of the sampling stage in the comparison cycle increases, the power consumption that generates this Vcm voltage increases. Especially for applications in high-speed SAR-ADC, the establishment time of Vcm may reach half of the entire cycle, and the power consumption caused by generating the Vcm voltage is very high. Taking an ADC with a sampling rate of 4 MHz as an example, the power consumption of the Vcm generation circuit accounts for more than 70% of the total power consumption.

At present, the use of capacitive voltage division to generate common mode level Vcm (FIG. 4) can greatly reduce the static power consumption. Its working principle is as follows:

In the sampling stage, S3 is closed, the upper electrode plates of all capacitors are connected to $V_{REFP}$, the lower electrode plates are connected to $V_{INM}$, and S2 is connected to $V_{REFP}$. At this time, $V_{DACP}$=$V_{DACN}$=$V_{REFP}$; the charges in the upper and lower capacitors are respectively:

$$Qp1 = (V_{REFP} - V_{INMP}) * 1/2 \; Ctot, \; Qn1 = (V_{REFP} - V_{INMN}) * 1/2 \; Ctot$$

In the holding stage, S2 is connected to $V_{REFP}$, and S3 for connecting the upper electrode plates to $V_{REFP}$ is disconnected. At this time, the charges in the upper and lower capacitors are respectively:

$$Qp2 = (V_{DAC} - V_{INMP}) * 1/2 \; Ctot + (V_{DAC} - V_{REFN}) * 1/2 \; Ctot$$

$$Qn2 = (V_{DAC} - V_{INMN}) * 1/2 \; Ctot + (V_{DAC} - V_{REFN}) * 1/2 \; Ctot$$

Due to the conservation of charge, Qp2+Qn2=Qp1+Qn1, resulting in $V_{DAC}$=½ ($V_{REFP}$+$V_{REFN}$). The subsequent redistribution stage is similar to that of the traditional SAR ADC.

Although this method can eliminate the voltage dividing circuit and the operational amplification module in the traditional solution and greatly reduce the power consumption, it requires at least adding a voltage dividing capacitor with a capacitance value that is equal to the capacitance value of the sampling capacitor, resulting in a doubling of the capacitor area. With the improvement of ADC accuracy, the capacitor area will increase exponentially, making it limited in high-precision applications.

Therefore, in order to solve the problems of high power consumption and large area of the Vcm generation circuit in the traditional SAR ADC architecture, a more efficient DAC structure is needed.

BRIEF SUMMARY

In view of the disadvantages of the existing technology mentioned above, the purpose of this application is to provide a novel capacitive DAC structure to solve the problems of high power consumption and large area of the common mode level Vcm generation circuit in the SAR ADC architecture in the existing technology.

In order to achieve the above and other related purposes, this application provides a novel capacitive DAC structure, wherein the novel capacitive DAC structure at least includes a fully differential DAC capacitor array, a comparator, and a sampling and holding switch provided between the fully differential DAC capacitor array and the comparator;

the fully differential DAC capacitor array includes a first DAC capacitor array and a second DAC capacitor array, and the comparator includes a first input level end and a second input level end;

the sampling and holding switch includes a first logic switch, a second logic switch and a third logic switch, the first logic switch is provided between the first input level end and the second input level end, the second logic switch is provided between an upper electrode plate of the first DAC capacitor array and the first input level end, and the third logic switch is provided between an upper electrode plate of the second DAC capacitor array and the second input level end.

Exemplarily, the second logic switch is disconnected or selectively connected to a first reference level end or the first input level end; the third logic switch is disconnected or selectively connected to a second reference level end or the second input level end.

Exemplarily, the first DAC capacitor array includes a plurality of first capacitors, and upper electrode plates of the first capacitors are all connected to the second logic switch; the second DAC capacitor array includes a plurality of second capacitors, and upper electrode plates of the second capacitors are all connected to the third logic switch.

Exemplarily, the first capacitors and the second capacitors are the same in parameters, and respectively include N+1 capacitors with capacitance values of C, C, 2C . . . $2^{N-1}$C, where N is an integer.

Exemplarily, the fully differential DAC capacitor array further includes a plurality of first switches and a plurality of second switches, the first switches are connected to lower electrode plates of the first capacitors, the lower electrode plates of the two first capacitors with a capacitance value of C are connected to the same first switch, and the lower electrode plates of the other first capacitors are respectively connected to the respective first switches; the second switches are connected to lower electrode plates of the second capacitors, the lower electrode plates of the two second capacitors with a capacitance value of C are connected to the same second switch, and the lower electrode plates of the other second capacitors are respectively connected to the respective second switches.

Exemplarily, a method for generating the common mode level by using the capacitive DAC structure includes:

1) firstly, entering a sampling stage, connecting the first switches to a first input signal end, connecting the second switches to a second input signal end, disconnecting the first logic switch, connecting the second logic switch to the first reference level end, and connecting the third logic switch to the second reference level end;

2) then, closing the first logic switch, connecting the second logic switch to the first input level end, and connecting the third logic switch to the second input level end to obtain the stable common mode level.

Exemplarily, the capacitive DAC structure includes a 12-bit capacitive DAC structure.

As described above, the novel capacitive DAC structure provided in this application has the following beneficial effects:

In this application, by providing the sampling and holding switch, including the first logic switch, the second logic switch and the third logic switch, between the fully differential DAC capacitor array and the comparator, and changing the timing relationship of the switches to generate the stable common mode level Vcm, the area and power consumption can be greatly reduced, the IP competitiveness can be effectively improved, and it can be used for high-performance ADC design.

Figure 1:
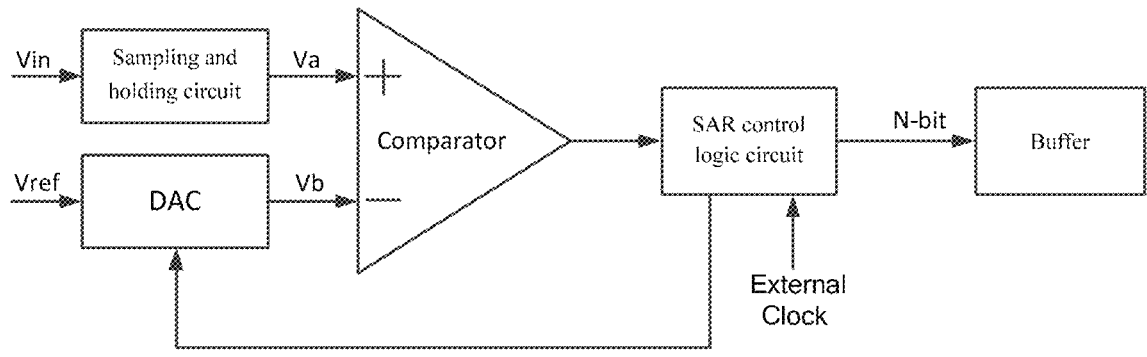
FIG. 1 illustrates a schematic block diagram of an SAR ADC in the existing technology.
Figure 2:
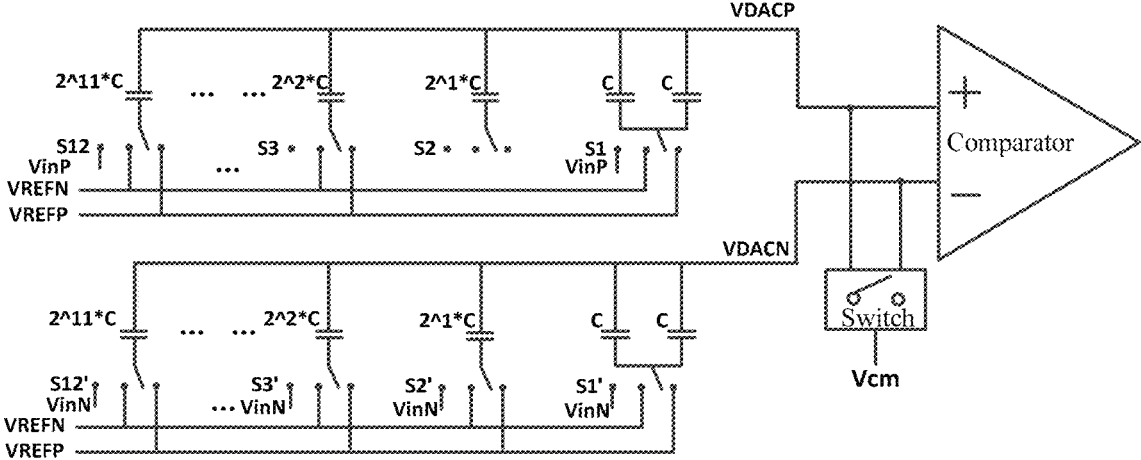
FIG. 2 illustrates a schematic diagram of a capacitive DAC structure in the existing technology.
Figure 3:
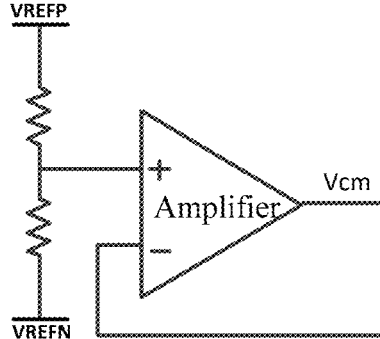
FIG. 3 illustrates a schematic diagram of a common mode level Vcm generation circuit in the existing technology.
Figure 4:
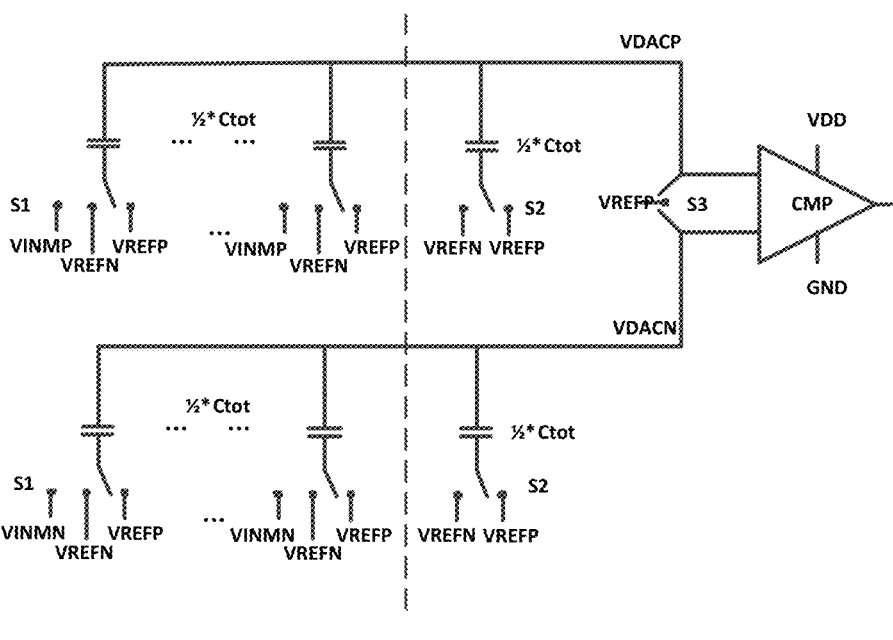
FIG. 4 illustrates a schematic diagram of a circuit for generating common mode level Vcm through capacitive voltage division in the existing technology.

DESCRIPTION OF REFERENCE SIGNS OF COMPONENTS 1 fully differential DAC capacitor array
101 first DAC capacitor array
102 second DAC capacitor array
103 first switch
104 second switch
2 comparator
3 sampling and holding switch
301 first logic switch
302 second logic switch
303 third logic switch

DETAILED DESCRIPTION OF THIS APPLICATION

Embodiments of this application will be described below through specific examples. Those skilled in the art can easily understand other advantages and effects of this application from the content disclosed in the description. This application can also be implemented or applied through other different specific embodiments. Various details in the description can also be modified or changed based on different perspectives and applications without departing from the spirit of this application.

Figure 5:
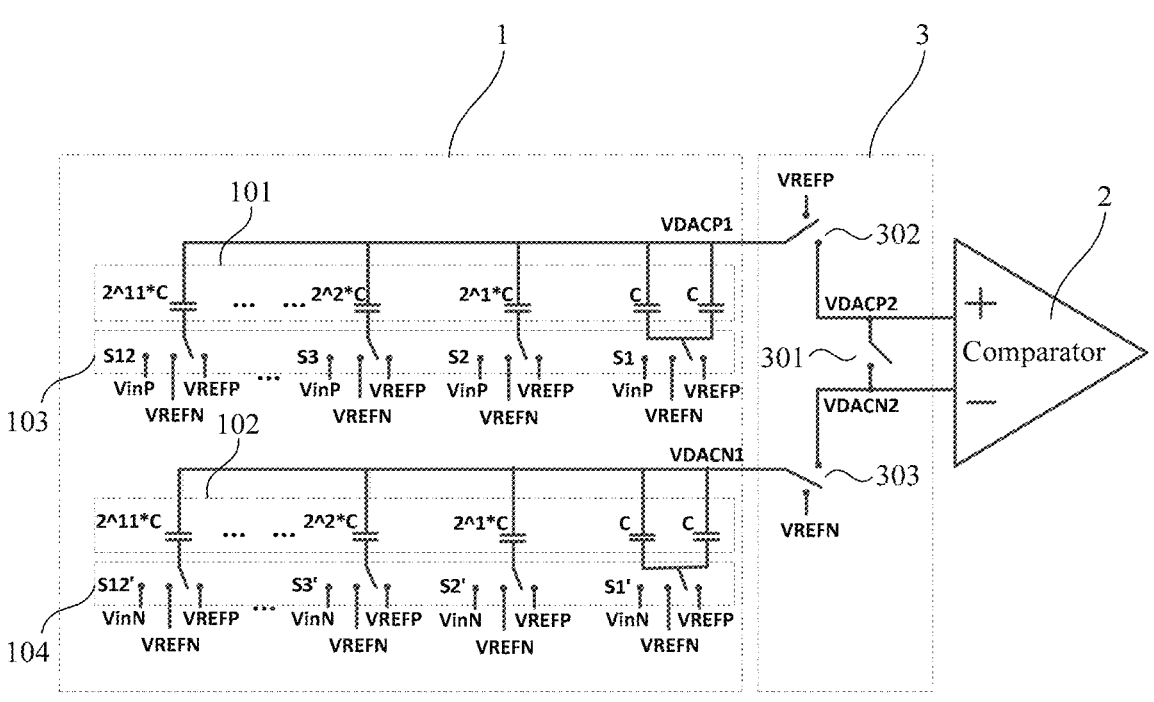
FIG. 5 illustrates an exemplary diagram of a novel capacitive DAC structure according to this application.
Figure 6:
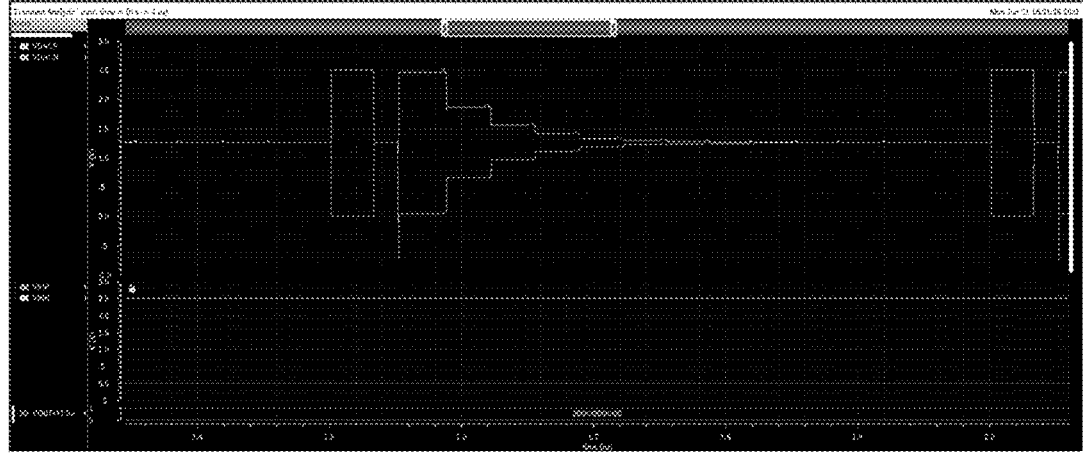
FIG. 6 and FIG. 7 respectively illustrate simulation results of an ADC of a capacitive DAC structure according to this application.
Figure 7:
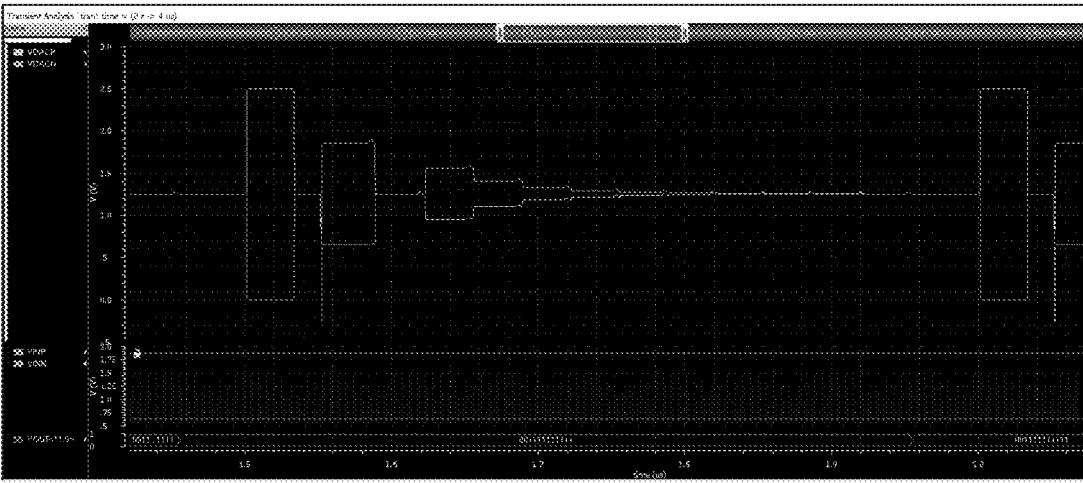

Please refer to FIG. 5-7. It should be noted that the drawings provided in the embodiments only schematically describe the basic concept of this application. Therefore, the drawings only illustrate the components related to this application, instead of being drawn according to the actual number, shape, and size of the components during implementation. The configuration, number, and scale of each component during actual implementation may be freely changed, and the component layout may also be more complex.

This application provides a novel capacitive DAC structure. Referring to FIG. 5, the novel capacitive DAC structure at least includes a fully differential DAC capacitor array 1, a comparator 2, and a sampling and holding switch 3 provided between the fully differential DAC capacitor array 1 and the comparator 2.

The fully differential DAC capacitor array 1 includes a first DAC capacitor array 101 and a second DAC capacitor array 102. The comparator 2 includes a first input level end ($V_{DACP2}$) and a second input level end ($V_{DACN2}$).

The sampling and holding switch 3 includes a first logic switch 301, a second logic switch 302 and a third logic switch 303. The first logic switch 301 is provided between the first input level end and the second input level end. The second logic switch 302 is provided between an upper electrode plate of the first DAC capacitor array 101 and the first input level end. The third logic switch 303 is provided between an upper electrode plate of the second DAC capacitor array 102 and the second input level end.

As an example, the second logic switch 302 is disconnected or selectively connected to a first reference level end (which is used for inputting reference level $V_{REFP}$) or the first input level end (which is used for inputting a signal $V_{DACP2}$). The third logic switch 303 is disconnected or selectively connected to a second reference level end (which is used for inputting reference voltage $V_{REFN}$) or the second input level end ($V_{DACN2}$). The first logic switch 301, the second logic switch 302, and the third logic switch 303 are selectively to be disconnected from or connected to the input level of the reference level or the comparator 2 according to the timing relationship.

As an example, the first DAC capacitor array 101 includes a plurality of first capacitors. Upper electrode plates of the first capacitors are all connected to the second logic switch 302. The second DAC capacitor array 102 includes a plurality of second capacitors. Upper electrode plates of the second capacitors are all connected to the third logic switch 303.

As an example, the first capacitors and the second capacitors are the same in parameters, and respectively include N+1 capacitors with capacitance values of C, C, 2C . . . $2^{N-1}$C, where N is an integer.

In a specific embodiment, the capacitive DAC structure includes a 12-bit capacitive DAC structure. In a case that N is 12, the first capacitor includes 13 capacitors with capacitance values of C, C, 2C, 4C, 8C . . . . Similarly, the second capacitor also includes 13 capacitors with capacitance values of C, C, 2C, 4C, 8C . . . . Of course, this application is not limited to a 12-bit capacitive DAC and can be extended to any bits.

As an example, the fully differential DAC capacitor array further includes a plurality of first switches 103 and a plurality of second switches 104. The first switches 103 are connected to lower electrode plates of the first capacitors. The lower electrode plates of the two first capacitors with a capacitance value of C are connected to the same first switch 103. The lower electrode plates of the other first capacitors are respectively connected to the respective first switches 103. The second switches 104 are connected to lower electrode plates of the second capacitors. The lower electrode plates of the two second capacitors with a capacitance value of C are connected to the same second switch 104. The lower electrode plates of the other second capacitors are respectively connected to the respective second switches 104.

As an example, a method for generating the common mode level by using the capacitive DAC structure includes the following steps:

1) Firstly, a sampling stage is entered, the first switches 103 are connected to a first input signal end (input signal $V_{inP}$), the second switches 104 are connected to a second input signal end (input signal $V_{inN}$), the first logic switch 301 is disconnected, the second logic switch 302 is connected to the first reference level end ($V_{REFP}$), and the third logic switch 303 is connected to the second reference level end ($V_{REFN}$). That is, the upper electrode plate of the capacitor is connected to a fixed potential $V_{REFP}/V_{REFN}$, and the lower electrode plate is connected to an input signal for sampling. At this time, the amounts of charges stored in the upper DAC capacitor array 101 and the lower DAC capacitor array 102 are as follows:

$$Qp = (V_{REFP} - V_{inP}) * 4096 \ Cu \qquad (1)$$

$$Qn = (V_{REFN} - V_{inN}) * 4096 \ Cu \qquad (2)$$

where Cu is unit capacitance value.

2) After sampling is completed, a stage of establishing first-time reference voltage is entered, the first logic switch 301 is closed, the second logic switch 302 is connected to the first input level end, and the third logic switch 302 is connected to the second input level end. That is, the upper electrode plate $V_{DACP1}$ of the first capacitor is connected to $V_{DACP2}$, the upper electrode plate $V_{DACN1}$ of the second capacitor is connected to $V_{DACN2}$, and the upper electrode plates of the first capacitors and the second capacitors are connected.

Due to the conservation of total charge, the charges will be redistributed, ultimately obtaining stable upper electrode plate voltage $V_{DAC}$. Using the principle of conservation of charges, the following can be obtained:

$$(V_{DAC} - V_{inP}) * 4096 \ Cu + (V_{DAC} - V_{inN}) * 4096 \ Cu = Qp + Qn \qquad (3)$$

That is, $V_{DA}C = \frac{1}{2}*(V_{REFP}+V_{REFN})$, where $V_{DAC}$ refers to the common mode level Vcm. After the $V_{DAC}$ is stabilized, the first logic switch 301 is disconnected, the lower electrode plates of the capacitors are disconnected from the input signals $V_{inP}$ and $V_{inN}$, and then a holding and comparison stage is entered, which is the same as the conventional SAR ADC. The DAC circuit provided in this application only has small dynamic power consumption in the sampling stage, thus avoiding the continuous static power consumption caused by the use of a voltage divider or current mirror bias in the traditional SAR-ADC to generate Vcm. Moreover, the original capacitors of the DAC capacitor array are utilized to generate Vcm, and a low-power and small-area DAC structure is achieved only by changing the logic switches and the timing sequence.

In addition, this application has been verified through circuit design and Virtuoso simulation. It can be found that the results obtained by this application are consistent with expectations. The DAC design in this application, in conjunction with timing control, achieves the generation of the common mode level. The simulation results of the ADC using the DAC in this application are as illustrated in FIG. 6 and FIG. 7, which can achieve the function of converting analog signals to logic signals. The input signals are 0V (FIG. 6) and ¼*VDD25 (FIG. 7), respectively. The output results are consistent with the input signals. The functional and performance deviation of the SAR ADC using the DAC solution of this application from the theoretical value is within ±1LSB, which achieves an ideal state. LSB refers to Least Significant Bit. With 1LSB as a unit, taking 12-bit as an example, $1LSB=(V_{REFP}-V_{REFN})/2^{12}$.

It should be noted that this application is not limited to the application of the DAC in the SAR ADC, and can be extended to other DAC applications.

To sum up, this application provides a novel capacitive DAC structure, which at least includes a fully differential DAC capacitor array, a comparator, and a sampling and holding switch provided between the fully differential DAC capacitor array and the comparator. This application innovatively designs a common mode level Vcm generation method based on the existing capacitive DAC structure, and achieves the generation of Vcm by using the principle of conservation of charges, the charge redistribution and the logic switch design, without adding capacitors or other operational amplifier circuits.

Therefore, this application effectively overcomes various disadvantages in the existing technology and has a high industrial utilization value.

The above embodiments only exemplarily describe the principle and effect of this application, and are not intended to limit this application. Anyone familiar with this technology may modify or change the above embodiments without departing from the spirit and scope of this application. Therefore, all equivalent modifications or changes made by those with ordinary knowledge in the technical field without departing from the spirit and technical concept disclosed in this application shall still be covered by the claims of this application.

What is claimed is:

1. A novel capacitive DAC structure, wherein the novel capacitive DAC structure at least comprises a fully differential DAC capacitor array, a comparator, and a sampling and holding switch provided between the fully differential DAC capacitor array and the comparator;

the fully differential DAC capacitor array comprises a first DAC capacitor array and a second DAC capacitor array, and the comparator comprises a first input level end and a second input level end;

the sampling and holding switch comprises a first logic switch, a second logic switch and a third logic switch, the first logic switch is provided between the first input level end and the second input level end, the second logic switch is provided between an upper electrode plate of the first DAC capacitor array and the first input level end, and the third logic switch is provided between an upper electrode plate of the second DAC capacitor array and the second input level end;

the first DAC capacitor array comprises a plurality of first capacitors, and upper electrode plates of the first capacitors are all connected to the second logic switch; the second DAC capacitor array comprises a plurality of second capacitors, and upper electrode plates of the second capacitors are all connected to the third logic switch;

the fully differential DAC capacitor array further comprises a plurality of first switches and a plurality of second switches, the first switches are connected to lower electrode plates of the first capacitors, the lower electrode plates of the two first capacitors with a capacitance value of C are connected to the same first switch, and the lower electrode plates of the other first capacitors are respectively connected to the respective first switches; the second switches are connected to lower electrode plates of the second capacitors, the lower electrode plates of the two second capacitors with a capacitance value of C are connected to the same second switch, and the lower electrode plates of the other second capacitors are respectively connected to the respective second switches.

2. The novel capacitive DAC structure according to claim 1, wherein the second logic switch is disconnected or selectively connected to a first reference level end or the first input level end; the third logic switch is disconnected or selectively connected to a second reference level end or the second input level end.

3. The novel capacitive DAC structure according to claim 1, wherein the first capacitors and the second capacitors are the same in parameters, and respectively comprise N+1 capacitors with capacitance values of C, C, 2C . . . $2^{N-1}C$, where N is an integer.

4. The novel capacitive DAC structure according to claim 3, wherein a method for generating the common mode level by using the capacitive DAC structure comprises:

1) firstly, entering a sampling stage, connecting the first switches to a first input signal end, connecting the second switches to a second input signal end, disconnecting the first logic switch, connecting the second logic switch to the first reference level end, and connecting the third logic switch to the second reference level end;

2) then, closing the first logic switch, connecting the second logic switch to the first input level end, and connecting the third logic switch to the second input level end to obtain the stable common mode level.

5. The novel capacitive DAC structure according to claim 3, wherein the capacitive DAC structure comprises a 12-bit capacitive DAC structure.

* * * * *